United States Patent [19]

Pohl et al.

[11] 3,927,943

[45] Dec. 23, 1975

[54] MASK ALIGNMENT METHOD

[75] Inventors: Karl-Heinz Pohl, Boulder; Jack Theodore Schierle, Broomfield, both of Colo.

[73] Assignee: Bell Telephone Laboratories, Incorporated, Murray Hill, N.J.

[22] Filed: July 1, 1974

[21] Appl. No.: 484,762

[52] U.S. Cl. .................................. 355/132; 355/91

[51] Int. Cl.² .......................................... G03B 27/02

[58] Field of Search ........ 355/91, 94, 125, 132, 133

[56] References Cited

UNITED STATES PATENTS

| | | | |
|---|---|---|---|
| 601,882 | 4/1898 | Schwarz | 355/91 |
| 1,786,070 | 12/1930 | Jones | 355/125 |
| 1,857,381 | 5/1932 | Haebner | 355/91 |
| 1,920,400 | 8/1933 | Jones | 355/91 |
| 3,159,486 | 12/1964 | Henderson | 96/36.2 |
| 3,475,097 | 10/1969 | Bishop et al. | 355/91 |
| 3,597,081 | 8/1971 | Cason et al. | 355/91 |

*Primary Examiner*—Richard M. Sheer
*Attorney, Agent, or Firm*—R. B. Anderson

[57] ABSTRACT

Precisely aligned contact printing on opposite sides of a sensitized substrate is accomplished by mounting first and second masks in first and second support members, adjusting the first support member to align the masks with respect to a common alignment pin, removing the second support member, mounting the substrate in a third support member, aligning the substrate with the first mask, forcing the substrate into contact with the first mask and magnetically holding it in place, removing the third support member, fastening the second support member to the first support member with the alignment pin, and providing a vacuum between the masks to draw them into substantially uniform contact on opposite sides of the substrate. With the masks and substrate mutually registered, accurate photolithographic exposure of the opposite substrate surfaces can be made.

7 Claims, 7 Drawing Figures

MASK ALIGNMENT METHOD

BACKGROUND OF THE INVENTION

This invention relates to alignment methods, and more particularly, to methods for precisely registering photolithographic masks on opposite sides of a substrate.

Modern electronic systems make extensive use of printed circuits; that is, circuits in which the locations of conductors are photolithographically defined on an insulative substrate. A common objective in designing such circuits is to reduce their overall size by increasing the density of conductors being defined. Thus, it is often desirable to form conductors on opposite sides of an insulative substrate; and to define such conductors with great precision so that they may be made small and densely packed and so that connections to them can be made accurately and dependably. This requires that photolithographic masks be positioned on opposite sides of the substrate such that the substrate and both masks are mutually registered. As the registration accuracy requirements become more stringent, the needed alignment techniques typically become increasingly complex and difficult to perform.

SUMMARY OF THE INVENTION

Accordingly, it is an object of this invention to provide methods for accurately registering mask patterns on opposite sides of a substrate.

This and other objects of the invention are attained by the technique described in the abstract of the disclosure.

In accordance with one feature of the invention, the first mask is aligned with the second mask by orienting it within an adjustable frame. Next, the substrate is aligned with the first mask by orienting the substrate within an adjustable frame. The substrate is fixed to the first mask, and the second mask is clamped on the opposite side of the substrate with the aid of an alignment pin which assures that all of the elements are brought into mutual alignment.

One significant feature is the transfer of the substrate to the first mask, which is accomplished by attaching ferromagnetic elements to the substrate, holding the substrate against a spring bias by a vacuum, aligning the substrate with the first mask, and releasing the vacuum so that the spring bias forces the substrate up against the first mask. Then, magnets are placed on the opposite side of the first mask to hold the substrate in position so that the third support may be removed. Thereafter, the second mask can be brought into contact with the exposed side of the substrate.

The technique is straightforward and easy to use by a relatively unskilled operator. Extremely fine accuracies may be realized, which increases the packing densities of conductors that can be designed into the circuits being made.

These and other objects, features and advantages of the invention will be better understood from the following detailed description taken in conjunction with the accompanying drawing.

DRAWING DESCRIPTION

DETAILED DESCRIPTION

Figure 1:
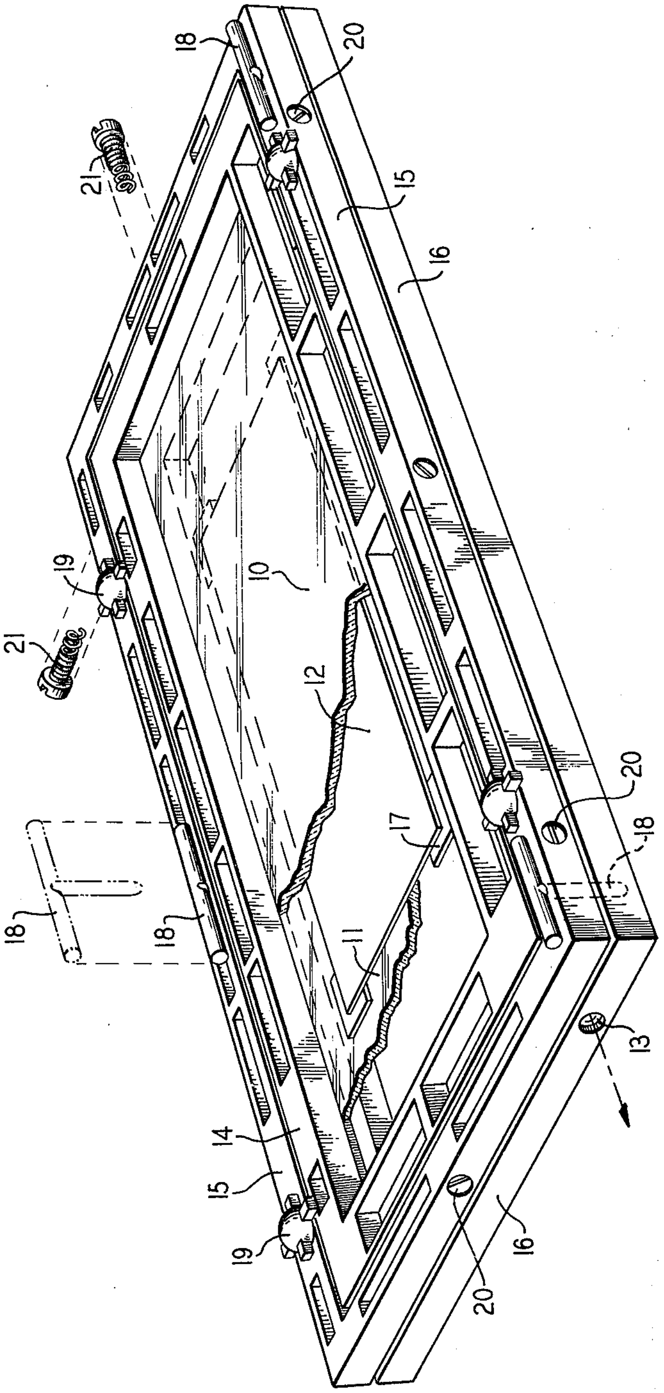
FIG. 1 is a perspective view, partially fragmented, of a mask assembly in accordance with an illustrative embodiment of the invention.

FIG. 1 shows a mask assembly in accordance with one embodiment of the invention comprising a first mask 10 and a second mask 11 contained on opposite sides of a substrate 12. The masks are of a type known in the art as contact glass masks, and typically contain a conductor pattern, which, for purposes of clarity, has not been shown. The substrate 12 is coated with photosensitive material such that when light is directed through masks 10 and 11 onto opposite sides of substrate 12, the mask patterns are printed on the two substrate surfaces.

Mask 10 is mounted on a support member 14 which in turn is included within a frame 15. Mask 11 is mounted within a frame 16 which is clamped to frame 15 by bolts 19. Frames 15 and 16 are vertically aligned with great precision by three alignment pins 18 which extend through both frames. As will be explained later, support member 14 is movable within frame 15 and its position may be adjusted by moving alignment screws 20.

A vacuum is applied to the region between masks 10 and 11 by way of a vacuum duct 13 so that the masks bear substantially uniformly on opposite sides of the substrate for dependable contact printing. In accordance with the invention, the mask assembly is designed so that the substrate 12 can be located within it in precise alignment with masks 10 and 11. The manner in which this is done can best be appreciated by a consideration of FIGS. 2 through 6 which illustrate successive steps in locating the substrate within the assembly.

Figure 2:
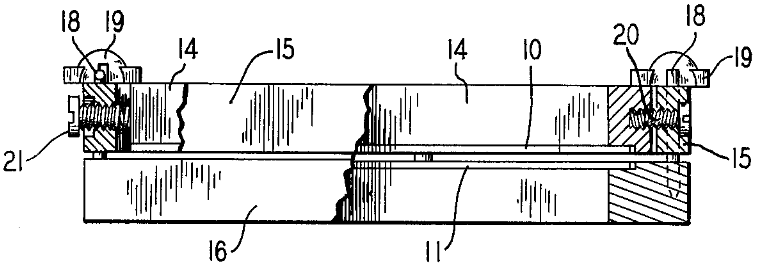
FIG. 2 is a sectional view of a mask assembly illustrating one step in the alignment of masks for the substrate.

Referring to FIG. 2, the first step in this technique is to bolt together frames 15 and 16 so as to align mask 10 with mask 11 in the absence of the substrate. Precise alignment of mask 10 with respect to mask 11 is made by moving alignment screws 20. Bearing against the support member 14 opposite each alignment screw is an alignment spring 21, only one of which is shown. (See also FIG. 1.) It can be appreciated, however, that with three alignment screws 20 as shown in FIG. 1, the support member 14 can be moved in orthogonal or "*x* and *y*" directions to give precise alignment of mask 10. The operator typically observes registration marks on masks 10 and 11 through a microscope while manually moving screws 20 in or out, and in this manner can register the two masks with great accuracy. Since the alignment of frames 15 and 16 is fixed by precision alignment pins 18, the movement of mask 10 can be considered as being a movement with respect to alignment pins 18.

Figure 3:
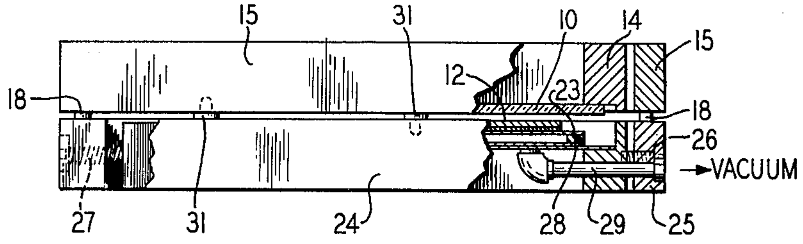
FIGS. 3, 4, 5 and 6 are sectional views of a mask assembly representing successive steps in alignment of a substrate with photolithographic masks.
Figure 7:
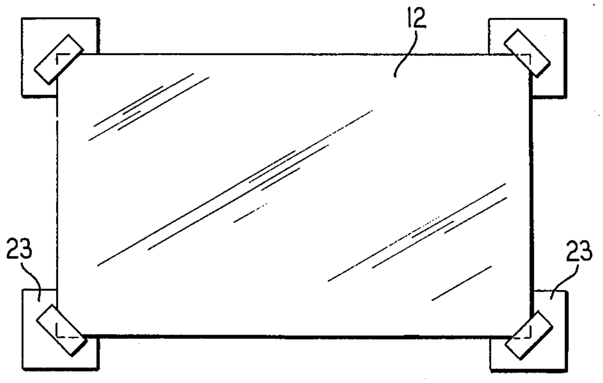
FIG. 7 is a plan view of the substrate used in FIG. 1.

Referring to FIG. 7, a plurality of ferromagnetic elements 23 which may be steel shims or the like are next attached to the corners of substrate 12. Referring to FIG. 3 substrate 12 is then mounted in a support 24 which is included within a frame 25. The frame 25 is similar to frame 15 in that it contains a similar plurality of alignment screws 26 each of which is in opposition to alignment springs 27. The substrate 12 is supported by a foam rubber element 28 and is held in place by a vacuum applied by a vacuum duct 29. The vacuum applied through vacuum duct 29 applies a force to the substrate in opposition to the spring bias of the foam rubber element 28.

After the substrate has been so positioned on support member 24, frame 25 is clamped to frame 15, the two being accurately registered by alignment pins 18. Next, the substrate is precisely aligned with mask 10 by movement in and out of alignment screws 26. The alignment screws provide small $x$ and $y$ direction displacements as the operator observes registration marks through a microscope, as described before. Appropriate spacer elements 31 on frame 26 maintain the substrate in close proximity to, but out of contact with, the mask 10.

Figure 4:
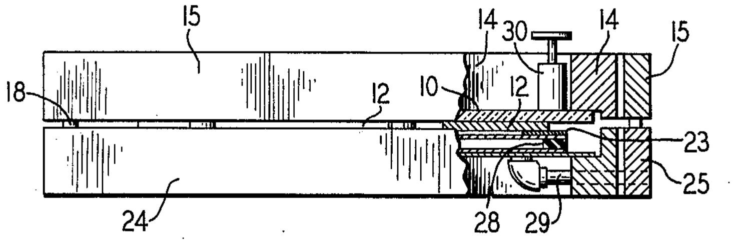

Referring to FIG. 4, after the alignment of the substrate, the vacuum is released which causes expansion by the spring bias element 28. The substrate is thereby forced into contact with the glass mask 10, after which four magnets 30 are placed on the upper surface of mask 10 opposite each of the ferromagnetic elements 23 (shown in FIG. 7). The foam rubber spring bias element 28 may typically be a strip arranged in a square so as to support the substrate near its periphery.

Figure 5:
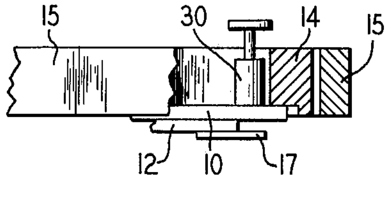
Figure 6:
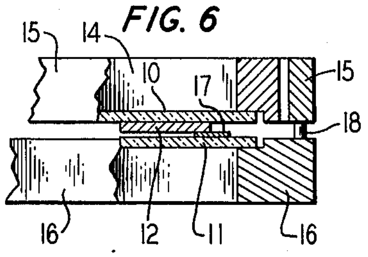

Referring to FIG. 5, frame 26 is next removed from frame 15, which leaves the substrate 12 fixed in place by the four magnets 30. Thereafter, as shown in FIG. 6, frame 16 is bolted to frame 15 to bring mask 11 into contact with the underside of substrate 12. This results in the assembly shown in FIG. 1, and a vacuum is then applied through vacuum duct 13 to bring the masks in substantially uniform contact with opposite sides of the substrate. It should be noted that, since mask 10 has previously been accurately aligned with mask 11, the insertion of the precision alignment pins 18 through frames 15 and 16 insures that these masks will again be in mutual alignment without any further adjustment. Since mask 10 has been precisely aligned with the substrate, the masks 10 and 11 and the substrate 12 are all in mutual alignment to within extremely close tolerances.

The apparatus described has been used for printing patterns on opposite sides of a number of substrates ranging in size from several inches on a side to as large as 10 inches by 28 inches. Mutual registration has been shown to be accurate to within 0.0005 inches, which permits full advantage to be taken of the capabilities of new collimated light sources for accurate conductor definition. This in turn has resulted in higher conductor packing densities with consequent savings of electrical circuit space and materials. The substrates used experimentally have been of insulative material, typically ceramic or plastic, and have been especially designed for the "back plane" wiring of private branch telephone exchanges. It can be appreciated that while great accuracy is obtainable, alignment can routinely be made by relatively unskilled operators with relative expediency.

The apparatus and method as described are intended to be merely illustrative of the inventive concepts involved. Various other embodiments and modifications may be made by those skilled in the art without departing from the spirit and scope of the invention.

What is claimed is:

1. A method for aligning first and second masks on opposite sides of a substrate, such that the masks and substrate are mutually registered, comprising the steps of:

mounting the first and second masks respectively in first and second supports;

coupling the first and second supports with an alignment member;

adjusting and fixing the orientation of the first support with respect to the alignment member;

removing the alignment member and the second support;

coating opposite sides of a substrate with photosensitive material;

mounting the sensitized substrate in a third support;

coupling the first and third supports with said alignment member;

adjusting and fixing the orientation of the third support with respect to the alignment member;

fixing the substrate in contact with the first mask;

detaching the third support from the substrate and removing the third support and the alignment member; and coupling the first and second supports with said alignment member such that the substrate is contained between the first and second masks, whereby the first and second masks are registered with each other and with the substrate.

2. The method of claim 1 wherein:

the first support member is adjustably mounted within a first frame;

the second support member is mounted on a second frame;

the alignment member comprises a pin extending through apertures in the first and second frames; and the adjusting step comprises the step of moving the first support member within the first frame.

3. The method of claim 2 wherein:

the third support member is adjustably mounted within a third frame;

the alignment comprises a pin adapted to extend through apertures in the first and third frames; and the step of adjusting the third support member comprises the step of moving the third support member within the third frame.

4. The method of claim 3 wherein:

the step of mounting the substrate in the third support comprises the step of applying a force to the substrate in opposition to a spring bias;

the step of fixing the substrate in contact with the first mask comprises the step of releasing said force, thereby permitting the spring bias to force the substrate into contact with the first mask.

5. The method of claim 4 wherein:

the substrate is attached to a plurality of ferromagnetic elements; and the fixing step further comprises the step of locating magnets on the first mask opposite the substrate ferromagnetic elements, whereby the magnetic attraction of the magnets fixes the substrate to the first mask.

6. The method of claim 5 wherein:

the step of applying a force to the substrate comprises the step of applying a substantial vacuum to the side of the substrate opposite the first mask, thereby to hold the substrate in opposition to the spring bias; and the step of releasing the force on the substrate comprises the step of releasing said vacuum.

7. The method of claim 6 further comprising the step of:

applying a substantial vacuum to the region between the first and third supports after positioning of the substrate, thereby causing the first and second masks to contact the substrate substantially uniformly.

* * * * *